(12) United States Patent
Uzoh et al.

(10) Patent No.: US 10,410,977 B2
(45) Date of Patent: Sep. 10, 2019

(54) HIGH PERFORMANCE COMPLIANT SUBSTRATE

(71) Applicant: Invensas Corporation, San Jose, CA (US)

(72) Inventors: Cyprian Emeka Uzoh, San Jose, CA (US); Rajesh Katkar, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 15/592,973

(22) Filed: May 11, 2017

(65) Prior Publication Data

US 2017/0250140 A1     Aug. 31, 2017

Related U.S. Application Data

(62) Division of application No. 14/686,671, filed on Apr. 14, 2015, now Pat. No. 9,666,514.

(51) Int. Cl.
*H01M 2/08*      (2006.01)
*H01M 2/16*      (2006.01)
(Continued)

(52) U.S. Cl.
CPC .......... *H01L 23/562* (2013.01); *H01L 21/486* (2013.01); *H01L 21/4846* (2013.01);
(Continued)

(58) Field of Classification Search
CPC ... H05K 1/00; H05K 1/03; H05K 3/11; H05K 3/18; H05K 3/46; H05K 3/10; H05K 3/40; H01L 21/02; H01L 21/48; H01L 21/60; H01L 21/70; H01L 23/12; H01L 23/21; H01L 23/28; H01L 23/31; H01L 23/48; H01L 23/52; H01L 23/58; H01M 2/08; H01M 2/16; H01M 2/18; H01M 4/02;
(Continued)

(56) References Cited

U.S. PATENT DOCUMENTS 3,955,068 A    5/1976   Shaheen
4,464,489 A    8/1984   Noda et al.
(Continued)

FOREIGN PATENT DOCUMENTS

WO     20140197028 A2     12/2014

OTHER PUBLICATIONS

Guo et al., "Polyimide Aerogels Cross-Linked Through Amine Functionalized Polyoligomeric Silsesquioxane," ACS Applied Materials & Interfaces, Feb. 4, 2011.
(Continued)

*Primary Examiner* — Xiaoliang Chen

(57) ABSTRACT

A substrate structure is presented that can include a porous polyimide material and electrodes formed in the porous polyimide material. In some examples, a method of forming a substrate can include depositing a barrier layer on a substrate; depositing a resist over the barrier layer; patterning and etching the resist; forming electrodes; removing the resist; depositing a porous polyimide aerogel; depositing a dielectric layer over the aerogel material; polishing a top side of the interposer to expose the electrodes; and removing the substrate from the bottom side of the interposer.

6 Claims, 7 Drawing Sheets

(51) Int. Cl.

| | | |
|---|---|---|
| *H01M 2/18* | (2006.01) | |
| *H01M 4/02* | (2006.01) | |
| *H01M 4/04* | (2006.01) | |
| *H01M 4/52* | (2010.01) | |
| *H01M 4/80* | (2006.01) | |
| *H01M 4/485* | (2010.01) | |
| *H05K 1/00* | (2006.01) | |
| *H05K 3/10* | (2006.01) | |
| *H05K 3/40* | (2006.01) | |
| *H05K 3/46* | (2006.01) | |
| *H01L 23/00* | (2006.01) | |
| *H01L 21/48* | (2006.01) | |
| *H01L 23/498* | (2006.01) | |
| *H01L 23/538* | (2006.01) | |
| *H05K 1/02* | (2006.01) | |
| *H05K 1/03* | (2006.01) | |
| *H01L 23/15* | (2006.01) | |

(52) U.S. Cl.
CPC ........ *H01L 21/4857* (2013.01); *H01L 23/498* (2013.01); *H01L 23/4985* (2013.01); *H01L 23/49822* (2013.01); *H01L 23/49827* (2013.01); *H01L 23/49838* (2013.01); *H01L 23/49894* (2013.01); *H01L 23/5384* (2013.01); *H01L 23/5387* (2013.01); *H05K 1/0203* (2013.01); *H05K 1/0326* (2013.01); *H01L 23/15* (2013.01); *H01L 23/49866* (2013.01); *H05K 2201/062* (2013.01); *H05K 2201/10378* (2013.01)

(58) Field of Classification Search
CPC ............ H01M 4/04; H01M 4/52; H01M 4/80; H01M 4/485
USPC ........ 174/258, 264; 428/209, 215, 219, 458, 428/901, 284; 438/618, 622, 634, 639; 257/700, 723, 758, 774, 784; 429/94, 429/130, 144, 163, 174, 234, 246; 29/825, 829, 831, 832, 852; 204/284
See application file for complete search history.

(56) References Cited

U.S. PATENT DOCUMENTS

| | | | |
|---|---|---|---|
| 4,532,620 A | | 7/1985 | Matsuda et al. |
| 5,135,959 A | | 8/1992 | Hill |
| 5,149,615 A | | 9/1992 | Chakravorty et al. |
| 5,231,751 A | | 8/1993 | Sachdev et al. |
| 5,300,735 A | | 4/1994 | Yokono et al. |
| 5,481,795 A | * | 1/1996 | Hatakeyama ........ H05K 3/4069 174/264 |
| 5,484,647 A | * | 1/1996 | Nakatani ............... H05K 3/4069 361/748 |
| 5,582,858 A | | 12/1996 | Adamopoulos et al. |
| 5,706,578 A | | 1/1998 | Hubner |
| 5,972,482 A | * | 10/1999 | Hatakeyama .......... H05K 3/462 428/209 |
| 6,037,668 A | * | 3/2000 | Cave .................. H01L 23/5329 257/750 |
| 6,071,809 A | * | 6/2000 | Zhao ................... H01L 21/7681 257/E21.579 |
| 6,228,511 B1 | | 5/2001 | Sachdev et al. |
| 6,322,903 B1 | | 11/2001 | Siniaguine et al. |
| 6,338,984 B2 | | 1/2002 | Miniamio et al. |
| 6,376,370 B1 | * | 4/2002 | Farrar ............... H01L 21/76843 257/762 |
| 6,559,543 B1 | * | 5/2003 | Dunham ............ H01L 23/5329 257/758 |
| 6,635,967 B2 | | 10/2003 | Chang et al. |
| 6,696,529 B1 | * | 2/2004 | Mochizuki ............ G03F 7/037 525/420 |
| 6,727,576 B2 | | 4/2004 | Hedler et al. |
| 6,800,169 B2 | | 10/2004 | Liu et al. |
| 7,022,377 B2 | | 4/2006 | Kanada et al. |
| 7,199,450 B2 | | 4/2007 | Casey et al. |
| 7,294,393 B2 | * | 11/2007 | Murai ....................... B32B 7/12 174/258 |
| 7,294,919 B2 | | 11/2007 | Bai |
| 7,348,261 B2 | | 3/2008 | Caletka et al. |
| 7,539,038 B2 | | 5/2009 | Lee et al. |
| 7,557,448 B2 | | 7/2009 | Aggarwal et al. |
| 7,594,982 B1 | * | 9/2009 | Roscheisen ......... H01L 31/1884 136/263 |
| 7,619,315 B2 | | 11/2009 | Kwon et al. |
| 7,619,901 B2 | | 11/2009 | Eichelberger et al. |
| 7,781,492 B2 | | 8/2010 | Williams et al. |
| 7,791,203 B2 | | 9/2010 | Jeung et al. |
| 7,793,414 B2 | | 9/2010 | Haba et al. |
| 7,863,189 B2 | | 1/2011 | Basker et al. |
| 7,902,643 B2 | | 3/2011 | Tuttle |
| 7,919,844 B2 | | 4/2011 | Ozguz et al. |
| 7,944,034 B2 | | 5/2011 | Gerber et al. |
| 7,977,411 B2 | | 7/2011 | Williams et al. |
| 8,012,797 B2 | | 9/2011 | Shen et al. |
| 8,076,765 B2 | | 12/2011 | Chen et al. |
| 8,093,697 B2 | | 1/2012 | Haba et al. |
| 8,097,490 B1 | | 1/2012 | Pagaila et al. |
| 8,133,762 B2 | | 3/2012 | Pagaila et al. |
| 8,159,043 B2 | | 4/2012 | Yamazaki et al. |
| 8,193,604 B2 | | 6/2012 | Lin et al. |
| 8,198,729 B2 | * | 6/2012 | Chou .................. H01L 23/5227 257/698 |
| 8,241,955 B2 | | 8/2012 | Pagaila et al. |
| 8,253,230 B2 | | 8/2012 | Janzen et al. |
| 8,330,277 B2 | | 12/2012 | Machida |
| 8,354,297 B2 | | 1/2013 | Pagaila et al. |
| 8,354,304 B2 | | 1/2013 | Chow et al. |
| 8,389,378 B2 | | 3/2013 | Enquist et al. |
| 8,395,267 B2 | | 3/2013 | Roozenboom et al. |
| 8,586,408 B2 | | 11/2013 | Chen et al. |
| 8,618,659 B2 | | 12/2013 | Sato et al. |
| 8,709,938 B2 | | 4/2014 | Enquist et al. |
| 8,796,846 B2 | | 8/2014 | Lin et al. |
| 8,835,228 B2 | | 9/2014 | Mohammed |
| 8,841,765 B2 | | 9/2014 | Haba et al. |
| 8,922,005 B2 | | 12/2014 | Hu et al. |
| 8,945,677 B2 | * | 2/2015 | Zafiropoulos ........... C08L 79/08 427/337 |
| 8,974,903 B2 | | 3/2015 | Meador et al. |
| 9,018,094 B2 | | 4/2015 | Kosenko et al. |
| 9,048,222 B2 | | 6/2015 | Hung et al. |
| 9,109,088 B2 | | 8/2015 | Meador et al. |
| 9,125,333 B2 | | 9/2015 | Uzoh et al. |
| 9,171,756 B2 | | 10/2015 | Enquist et al. |
| 9,373,585 B2 | | 6/2016 | Uzoh et al. |
| 9,422,622 B2 | | 8/2016 | Storey |
| 9,449,723 B2 | | 9/2016 | Park et al. |
| 9,502,390 B2 | | 11/2016 | Caskey et al. |
| 9,640,504 B2 | | 5/2017 | Pagaila et al. |
| 9,646,917 B2 | * | 5/2017 | Katkar ................. H01L 23/481 |
| 2001/0013643 A1 | * | 8/2001 | Nakanishi ......... H01L 23/49575 257/678 |
| 2002/0109232 A1 | * | 8/2002 | Lin ...................... H01L 21/768 257/758 |
| 2002/0115282 A1 | * | 8/2002 | Lin ...................... H01L 21/768 438/622 |
| 2002/0121334 A1 | * | 9/2002 | Ikeda ......................... B32B 5/18 156/246 |
| 2002/0155700 A1 | * | 10/2002 | Chen ................ H01L 21/76843 438/639 |
| 2002/0172812 A1 | * | 11/2002 | Ikeda .................... H05K 3/4614 428/209 |
| 2002/0189088 A1 | * | 12/2002 | Kawashima ............... B32B 5/18 29/831 |
| 2002/0192870 A1 | * | 12/2002 | Ikeda .................... H05K 3/4617 438/118 |
| 2003/0022102 A1 | * | 1/2003 | Hiraoka ................. H05K 3/185 430/270.1 |

(56) References Cited

U.S. PATENT DOCUMENTS

| | | | |
|---|---|---|---|
| 2003/0122243 A1* | 7/2003 | Lee | H01L 21/4857 257/700 |
| 2003/0122244 A1* | 7/2003 | Lin | H01L 23/3114 257/700 |
| 2003/0122246 A1* | 7/2003 | Lin | H01L 23/36 257/723 |
| 2004/0009683 A1* | 1/2004 | Hiraoka | H01L 21/568 439/75 |
| 2004/0170754 A1* | 9/2004 | Tahara | H05K 1/0346 427/58 |
| 2004/0183209 A1* | 9/2004 | Lin | H01L 23/3171 257/778 |
| 2004/0245580 A1* | 12/2004 | Lin | H01L 21/768 257/379 |
| 2005/0074651 A1 | 4/2005 | Kidai et al. | |
| 2005/0096661 A1 | 5/2005 | Farrow et al. | |
| 2005/0277283 A1* | 12/2005 | Lin | H01L 23/53238 438/618 |
| 2005/0281995 A1* | 12/2005 | Murai | B32B 7/12 428/209 |
| 2006/0035152 A1* | 2/2006 | Nishimura | H01M 2/0207 429/234 |
| 2006/0060961 A1* | 3/2006 | Lin | H01L 23/3114 257/700 |
| 2006/0138605 A1* | 6/2006 | Pardo | B81C 3/001 257/643 |
| 2006/0251963 A1* | 11/2006 | Nakashima | H01M 2/1673 429/144 |
| 2007/0030681 A1* | 2/2007 | Farrell | B64D 43/00 362/257 |
| 2007/0190407 A1* | 8/2007 | Fujikawa | H01M 2/1673 429/130 |
| 2007/0231700 A1* | 10/2007 | Watanabe | H01M 2/145 429/246 |
| 2009/0166862 A1 | 7/2009 | Kweon et al. | |
| 2009/0200663 A1 | 8/2009 | Daubenspeck et al. | |
| 2011/0052971 A1* | 3/2011 | Fujikawa | H01M 2/22 429/161 |
| 2011/0068478 A1 | 3/2011 | Pagaila et al. | |
| 2012/0024581 A1* | 2/2012 | Hasegawa | H01B 3/445 174/258 |
| 2012/0073859 A1 | 3/2012 | Lo et al. | |
| 2012/0119193 A1* | 5/2012 | Sekiguchi | H01G 9/2004 257/40 |
| 2013/0020117 A1* | 1/2013 | Yamato | C08J 7/047 174/258 |
| 2013/0161826 A1* | 6/2013 | Son | H01L 23/481 257/774 |
| 2013/0189566 A1* | 7/2013 | Zinck | H01M 4/485 429/163 |
| 2014/0021630 A1* | 1/2014 | Lin | H01L 23/3171 257/774 |
| 2014/0178579 A1* | 6/2014 | Qi | G03G 15/2057 427/202 |
| 2014/0178658 A1* | 6/2014 | Qi | B32B 27/00 428/215 |
| 2014/0272358 A1* | 9/2014 | Meador | C08J 9/00 428/219 |
| 2014/0321894 A1* | 10/2014 | Qi | G03G 15/206 399/333 |
| 2015/0048487 A1* | 2/2015 | Jung | H01L 21/02126 257/632 |
| 2015/0141544 A1* | 5/2015 | Meador | C08G 73/101 521/183 |
| 2015/0262902 A1 | 9/2015 | Shen et al. | |
| 2015/0348873 A1* | 12/2015 | Katkar | H01L 23/481 257/774 |
| 2016/0003404 A1 | 1/2016 | Shibata et al. | |

OTHER PUBLICATIONS

International Search Report and Written Opinion for PCT/US2016/026226, dated Jul. 13, 2016, 11 pages.

Meador et al., "Mechanically Strong, Flexible Polyimide Aerogels Cross-Linked With Aromatic Triamine," ACS Applied Materials & Interfaces, 2012.

U.S. Appl. No. 61/952,066, titled, "Integrated Circuits Protected by Substrates with Cavities, and Methods of Manufacture," filed Mar. 12, 2014, 35 pages.

U.S. Appl. No. 14/214,365 titled, Integrated Circuits Protected by Substrates With Cavities, and Methods of Manufactures, filed Mar. 14, 2014, 40 pages.

* cited by examiner

HIGH PERFORMANCE COMPLIANT SUBSTRATE

CROSS-REFERENCE TO RELATED APPLICATION(S)

This application is a divisional of, and hereby claims priority to, pending U.S. patent application Ser. No. 14/686,671, filed on Apr. 14, 2015, the entirety of which is hereby incorporated by reference herein for all purposes.

BACKGROUND OF THE INVENTION

Technical Field

Embodiments of the present invention relate High Performance Interposers.

Discussion of Related Art

In Chip-first approach, the die are flip-chip mounted on a thick interposer wafer and then molded. In addition to providing electrical connections through the interposer, thermal insulation and warpage characteristics are also considered. Therefore, interposers should have good mechanical and thermal characteristics in order to both thermally insulate between devices mounted on the interposer and to reduce warpage of the final package.

Therefore, there is a need for high performance interposers and substrates.

SUMMARY

In accordance with aspects of the present invention, a substrate structure can include a porous polyimide material; and electrodes formed in the porous polyimide material. A method of forming a substrate can include depositing a barrier layer on a substrate; depositing a resist over the barrier layer; patterning and etching the resist; forming electrodes; removing the resist; depositing a porous polyimide aerogel; depositing a dielectric layer over the aerogel material; polishing a top side of the interposer to expose the electrodes; and removing the substrate from the bottom side of the interposer.

These and other embodiments are further discussed below with respect to the following figures.

DETAILED DESCRIPTION

In the following description, specific details are set forth describing some embodiments of the present invention. It will be apparent, however, to one skilled in the art that some embodiments may be practiced without some or all of these specific details. The specific embodiments disclosed herein are meant to be illustrative but not limiting. One skilled in the art may realize other elements that, although not specifically described here, are within the scope and the spirit of this disclosure.

This description and the accompanying drawings that illustrate inventive aspects and embodiments should not be taken as limiting—the claims define the protected invention. Various mechanical, compositional, structural, and operational changes may be made without departing from the spirit and scope of this description and the claims. In some instances, well-known structures and techniques have not been shown or described in detail in order not to obscure the invention.

Additionally, the drawings are not to scale. Relative sizes of components are for illustrative purposes only and do not reflect the actual sizes that may occur in any actual embodiment of the invention. Like numbers in two or more figures represent the same or similar elements.

Figure 1:
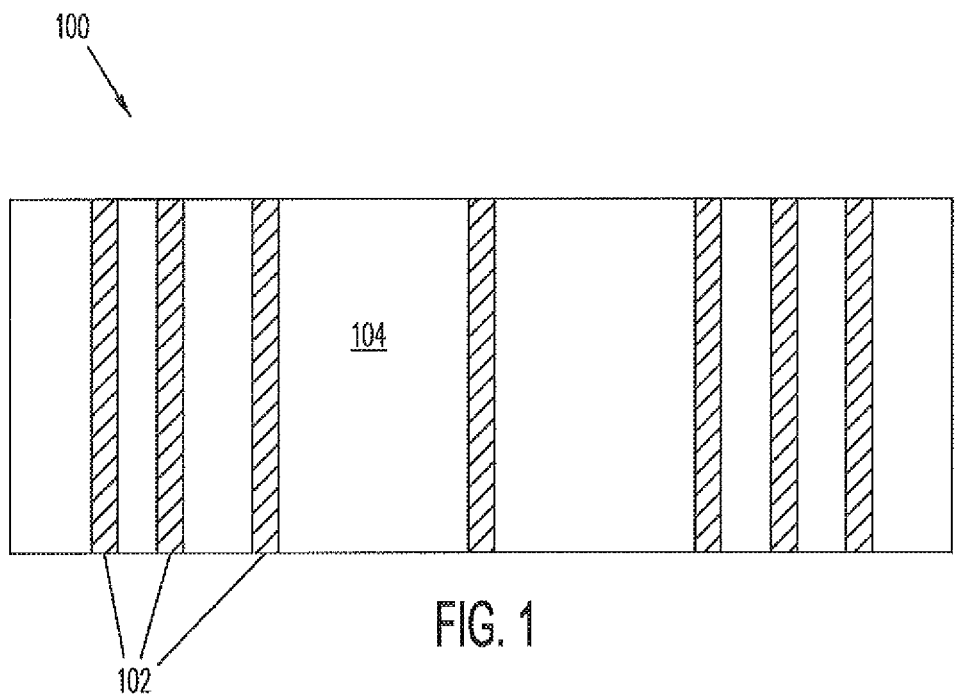
FIG. 1 illustrates an example interposer according to some embodiments of the present invention.

FIG. 1 illustrates an interposer or substrate 100 according to some embodiments of the present invention. As shown in FIG. 1, interposer or substrate 100 is formed by electrodes 102 embedded in a porous polyimide or in a mesoporous layer or material 104. Porous polyimide or mesoporous material 104 provides high thermal performance, high mechanical strength, as well as the ability to blunt stress fields and blunt propagating cracks. The ability to block cracks suppresses the propagation of cracks emanating from the topside or bottom side of material 104. In some embodiments, the material 104 may deform locally to cushion the large stresses generated by the various mechanical and electrical elements it supports.

Most aerogel products currently available are silica based and break down on handling, shedding small dust particles. Consequently, most conventional aerogels are encapsulated to prevent the dust. Additionally, the insulation properties of the aerogel degrade significantly over time. However, material 104 can be, for example, formed from a porous polyimide aerogel. Polyimide aerogels are flexible, mechanically robust and do not shed dust. Further, polyimide aerogels have good thermal conductivity and dielectric properties.

One polyimide aerogel has been developed by NASA and is described more fully in "Mechanically Strong, Flexible Polyimide Aerogels Cross-Linked with Aromatic Triamine" by Mary Ann B. Meador, Ericka J. Malow, Rebecca Silva, Sarah Wright, Derek Quade, Stephanie L. Vivod, Haiquan Guo, Jiao Guo, and Miko Cakmark, *ACS Applied Materials & Interfaces*, Sep. 6, 2012 and "Polyimide Aerogels Cross-Linked through Amine Functionalized Polyoligomeric Silsesquioxane" by Haiquan Guo, Mary Ann B. Meador, Linda McCorkle, Derek J. Quade, Jiao Guo, Bart Hamilton, Miko Cakmak, and Guilherme Sprowl, *ACS Applied Materials & Interfaces*, Feb. 4, 2011. Polyimide aerogels can be manufactured as a thin film, which can be flexible and yet maintain excellent tensile properties. Polyimide aerogels can be about 500 times stronger than traditional silica aerogels. Polyimide aerogels can be custom manufactured as thicker parts with no need to encapsulate or layer on a flexible matrix. In some embodiments, polyimide aerogels can have low thermal conductivity, for examples k values of 14-20 mW/m-K, which offers 2-5 times improved performance over polymer foams. The R values can range from 2-10 times higher than polymer foams, which is in line with silica aerogels of the same density. Polyimide aerogels can be composed of more than 95 percent air by volume and have densities as low as 0.08 g/cm$^3$. Polyimide aerogels can withstand temperatures up to 300° C.

In some embodiments, polyimide gels can be formed from combinations of diamine and dianhydride. For example, a combination of polyamic acid solutions of 3,3', 4,4'-bipheeyltetracroboxylic dianhydride (BPDA), bisaniline-p-xylidene (BAX) and OAPS that are chemically imidized and dried using supercritical $CO_2$. The polyimide gels can be cross-linked through a polyhedral oligomeric silsesquioxane (POSS) or aromatic triamine (TAB).

Polyimide aerogels can have a density as low as 0.08 g/cm$^3$, prosity greater than 90%, dielectric constant (X-band between 1.1 and 1.3), and Young's Modulas of 1-100 MPa depending on density.

The thermal conductivity of polyimide aerogels such as those used in the present embodiments, at room temperature, is about k=14 mW/m-K. This thermal conductivity is very low. For comparison, the thermal conductivity of various materials is provided in the following table:

| Material | Thermal conductivity (k in units of mW/m-K) |
| --- | --- |
| Polyimide Aerogel | 14-20 |
| Air | 24 |
| Carbon dioxide | 14.6 |
| fiberglass | 40 |
| Argon | 16 |
| Foam glass | 45 |
| glass | 1050 |
| gold | 310 × 10$^3$ |

Figure 3A:
FIGS. 3A through 3F illustrate structurally the process shown in FIG. 2.
Figure 2:
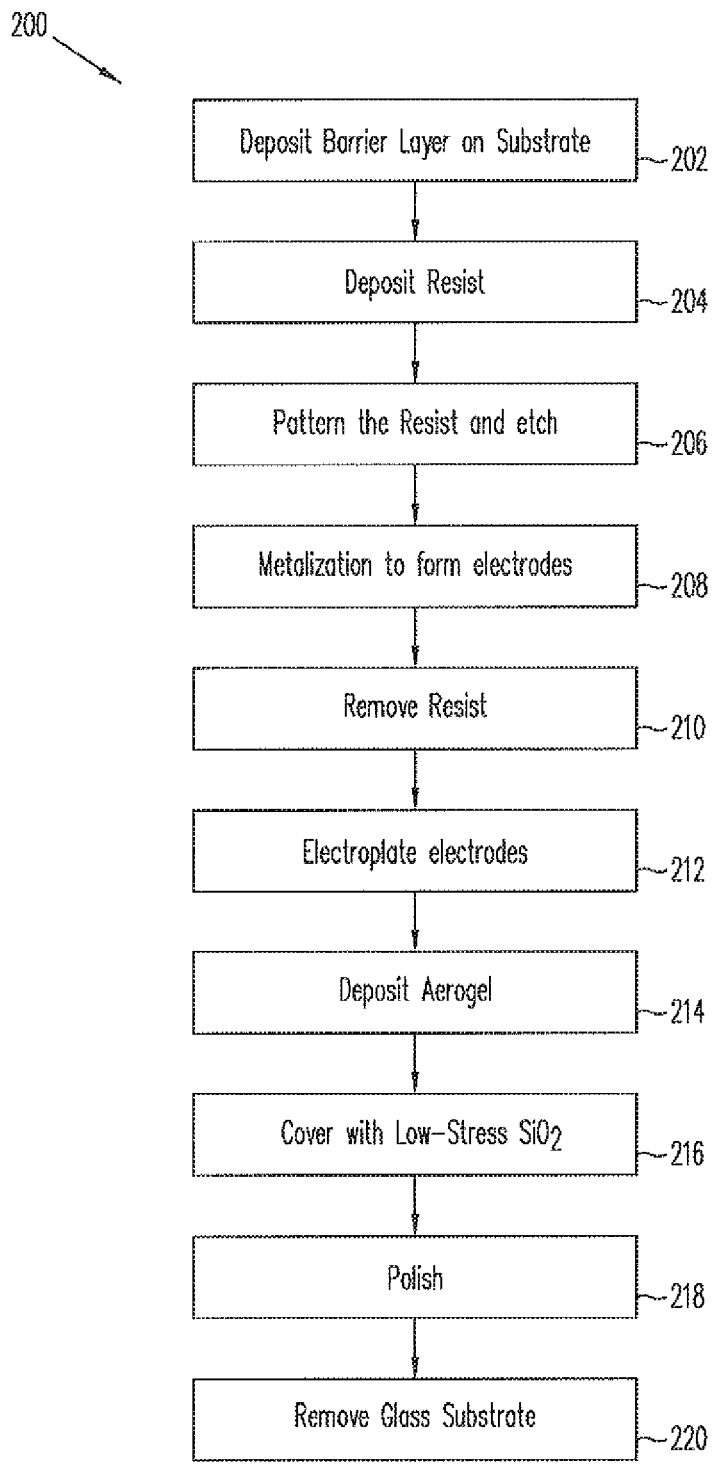
FIG. 2 illustrates a process for forming the example interposer illustrated in FIG. 1.

FIGS. 2 and 3A through 3F illustrate an example process for producing interposer 100 as illustrated in FIG. 1. As illustrated in FIGS. 2 and 3A, in step 202 a barrier layer 304 is deposited on a substrate 302. Substrate 302, for example, can be a dummy substrate or a silicon glass substrate. In some cases, substrate 302 can include active or passive devices. In some embodiments, substrate 302 may include blind cavities or recesses. Barrier layer 304 can be, for example, a Ni barrier layer, a TaN/Ta layer, a NiP layer, or a TiN layer, which is coated over the top surface of substrate 302. In some applications, the barrier layer may comprise of a dielectric material or combination of a dielectric layer and a conductive layer. In some embodiments, a seed layer (not shown) can be provided over barrier layer 304 if needed. For example, if barrier layer 304 is a platable material for example, nickel and some copper alloys, a seed layer may not be necessary. In step 204, a resist layer 306 can be deposited over barrier layer and/or seed layer 304. In some embodiments, layer 304 may comprise a distribution layer or interconnection layers for example BEOL. The interconnection layer can be capped with a dielectric layer. The dielectric can be patterned to expose electrical and or mechanical interconnection features beneath prior to seed layer coating and the formation of the resist layer.

Figure 3B:
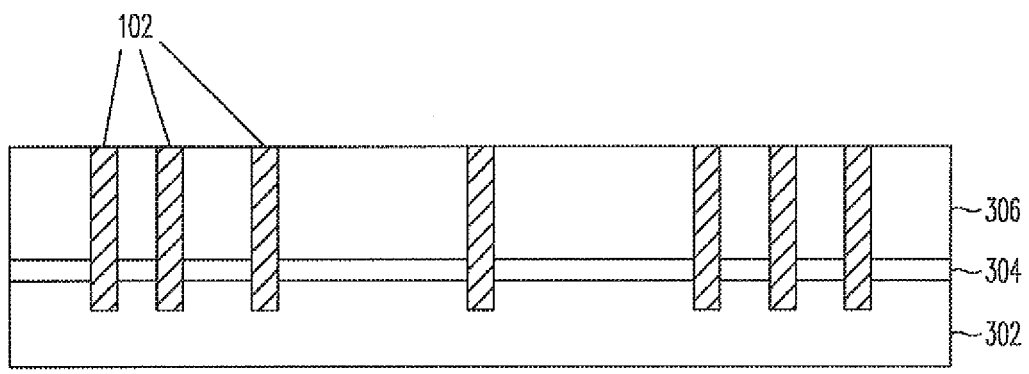
Figure 3C:
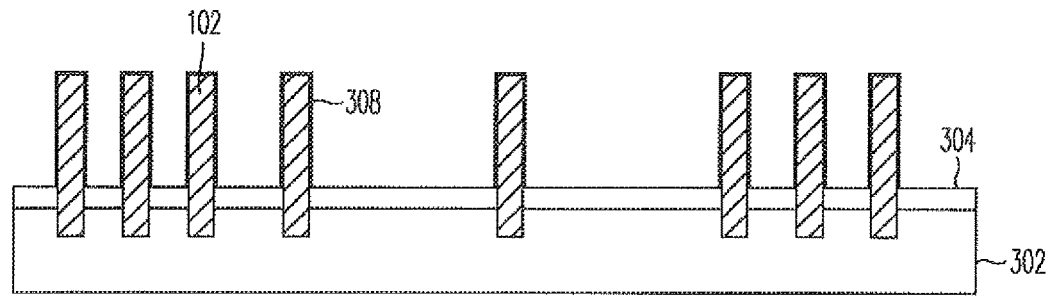
Figure 3D:
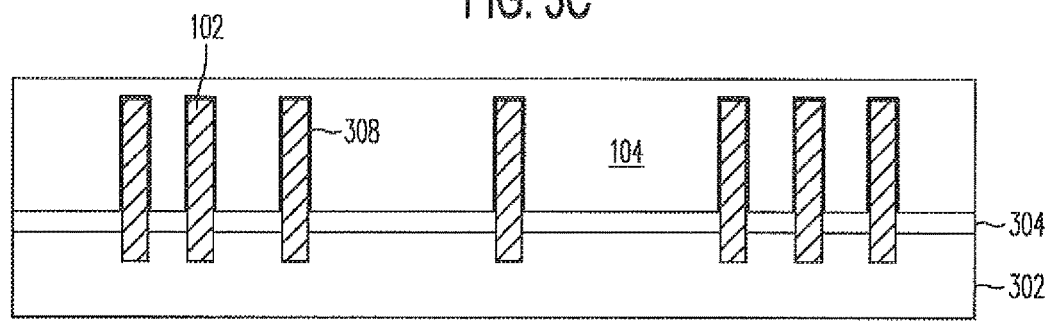

As shown in FIG. 2 and FIG. 3B, in step 206 resist layer 306 is patterned and in step 208 metal, for example copper, is deposited to form electrodes 102. In step 210, resist layer 306 is removed, barrier layer 304 (along with the seed layer if present) are removed selectively without removing significant portions of the plated feature 102. In step 212 and as shown in FIG. 3C, electrodes 102 can be coated, for example, with another barrier layer 308. Barrier layer 308 may be formed by selective or non-selective methods. In some embodiments, barrier layer 308 may be a conducting material formed by electroless methods, for example coating nickel or nickel alloys such as NiP, NiW, cobalt and cobalt alloys and combinations thereof on the plated structure 102. In other embodiments the barrier layer may be an insulator formed by PECVD or ALD or other known methods. The insulating barrier layer 308 may be formed of SiN, SIC, diamond like carbons (DLC). In some embodiments, the conductive material 102 can include wirebond. For example, the wirebond may be formed on exposed interconnection features. The conductive wirebond material may include Au, Ni, Cu and their various alloys and a clad layer or layers. When the conductive feature 102 is gold, the barrier layer 308 may not be needed. In some embodiments, conductive layer or layers can be formed by sputtering or electroplating methods or both. The said layer can be also formed by metal lamination methods. For example, a continuous conducting sheet is formed and then patterned to create structures such as those shown in FIG. 3C. In some applications, the metal etching is formed by using anisotropic etchants for the conductive features 102 and any traces of interest. For example, if the coated layer 102 comprise of titanium-aluminum-titanium laminate, chloride ions RIE plasma can be used to remove the unwanted portions of the blanket conductive layer to form at least features 102. In some applications, anisotropic metal removing formularies in the presence of electric field can be used to form conductive features 102 with aspect ratio (H/W) greater than 1.5. In step 214 and as shown in FIG. 3D, a foam material 104 is formed. In some embodiments, as discussed above, foam material 104 can be a polyimide aerogel or a mesoporous material. A polyimide aerogel can be spin-deposited and cured. In some embodiments, curing involves a heating step. In some embodiments mesoporous material other the polyimide aerogel may be used or used in combination with polyimide aerogel. In some embodiments, the dielectric constant k of the mesoporous layer can be less than 2.

In some embodiments, the coated metal 102 protrudes beyond the surface of the coated polymer aerogel. For example, the coated metal 102 may protrude at least more than 1 micron over the surface of the formed aerogel. A removal may be performed to expose the conductive electrode 102 on the top prior to the attachment of device 404. In certain embodiments, metal features 102 may not extend through the foam material, e.g. where damascene, conductive lines, traces, or other conductive features are desired. Moreover, while metal features 102 are shown extending through layers 302 and 304, this is not required and the features may not protrude through either or both of these layers.

Figure 3E:
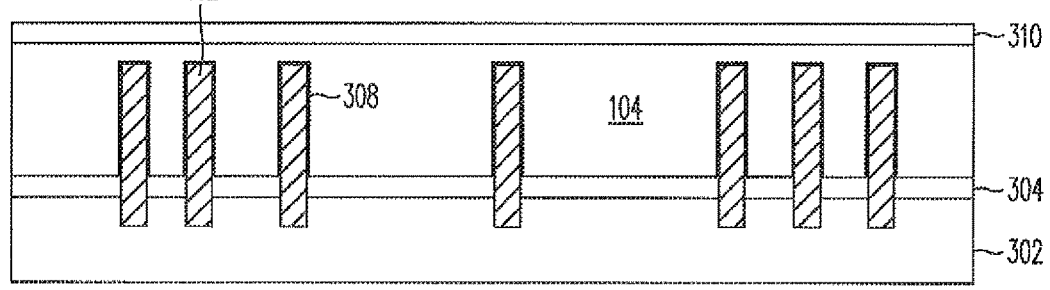

In some embodiments, in step 216, a low-stress dielectric layer, for example a Si-containing layer 310, is deposited over foam 104 as shown in FIG. 3E. Low-stress layer 310 can be, for example, a $SiO_2$ layer, a SiN layer, a SiON layer, a SiOF layer, a SiC layer, a diamond like carbon (DLC), a polyimide or combinations thereof. In step 218, a polish step is performed to expose electrodes 102 on the top. The coated dielectric layer may comprise the distribution layer. Portions of the distribution layer may be disposed beneath the exposed conductive electrode 102 and other portions over electrode 102. One or more metallization layers may be coated within the dielectric. In some applications, a contact pad structure (not shown) is coated over the appropriate conductors 102. Semiconductor devices 404 (see FIG. 4) and or passive circuit elements (not shown) may be attached to the top of material 104.

In some embodiments, the mesoporous layer of material 104 may be disposed over the seed layer 304. Cavities are then formed in the mesoporous layer material 104 by RIE methods or by ablation using laser beam for example. The exposed seed layer is cleaned and the conductive electrode is formed by plating methods or screen printing or particle filling methods, prior to subsequent steps. For example, solder balls or particles may be deposited in the cavities in material 104. The material 104 is thermal treated to fuse the solder material within the cavity. Any unwanted solder or other materials on the surface of material 104 is removed. In some applications, the removal step can comprise of high precision milling step to remove for example the top five (5) microns of material 104.

In some embodiments, the attached devices can be encapsulated, for example by transfer molding methods. In some embodiments, the Young's modulus of the encapsulant material is higher than that of aerogel material 104. In some embodiments, the Young's modulus of the encapsulant is similar to that of the aerogel material 104. In some embodiments, the Young's modulus of the encapsulant is lower than that of the aerogel 104. In some embodiments, the encapsulant can be mesoporous material. The top surface of the encapsulant may be polished if necessary to further reduce the thickness of the die and encapsulant. The encapsulated structures can be separated from the support layer 302 and any unwanted material on 104 can be removed including the original plating seed layer to expose the conductive feature 102.

Porous polyimide or mesoporous material 104 provides high thermal performance, high mechanical strength and the ability to blunt stress fields and blunt propagating cracks. The ability to block cracks suppresses the propagation of cracks emanating from disposed on the topside or bottom side of material 104. In some embodiments, the material 104 may deform microscopically locally to cushion the large stresses generated by the various mechanical and electrical elements it supports. The suppression of stress fields and crack propagation in microelectronic packages improves the yield and reliability of the entire package or packaged devices.

The top surface may be attached to a support layer to remove the support layer 302. In some applications where the support layer is comprised of embedded conductor 102, the support layer 302 may thinned down by known methods and processed to reveal the bottom side of the electrodes 102 in the remaining support layer 302 (not shown). Other structures may be attached to the backside of the support layer. The other structures may include a board, a substrate, a chip, a cooling element or another interposer.

Figure 3F:
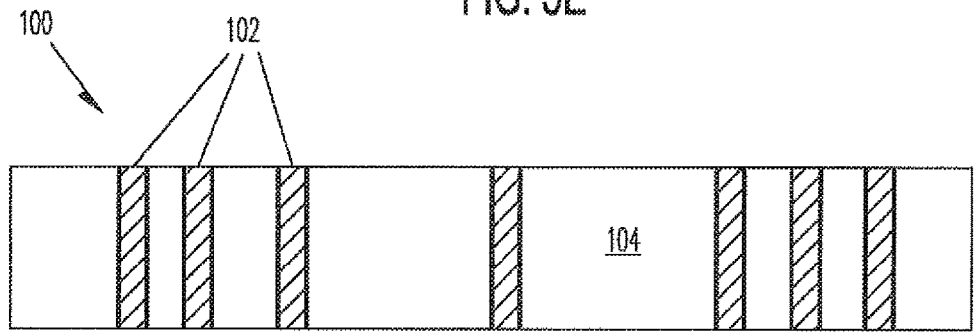

In step 220, as illustrated in FIG. 3F, glass substrate 302 and any unwanted materials are removed to expose electrodes 102 on the bottom.

Figure 4A:
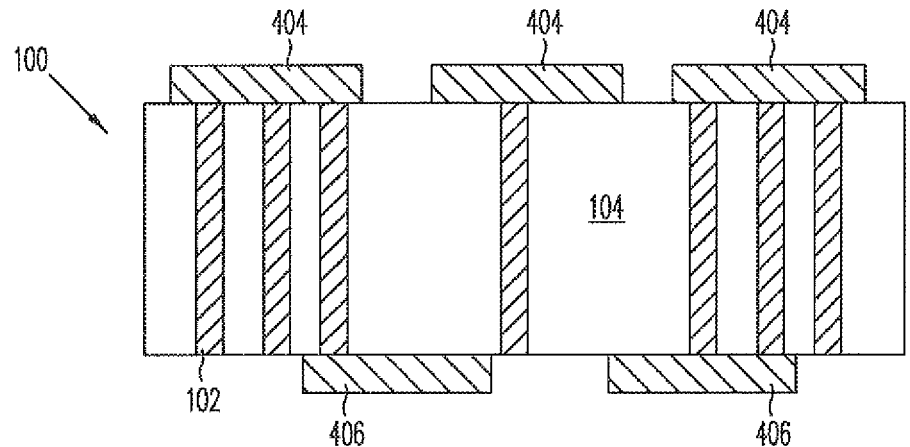
FIGS. 4A through 4H illustrates various configurations using interposers according to some embodiments of the present invention.
Figure 4B:
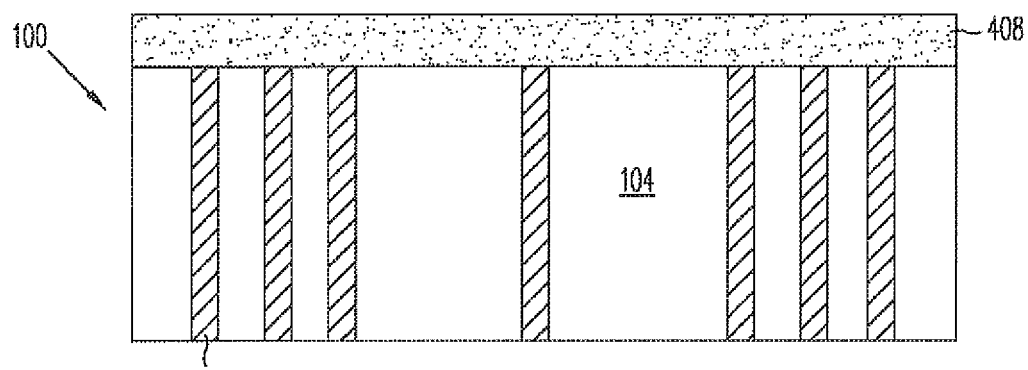
Figure 4C:
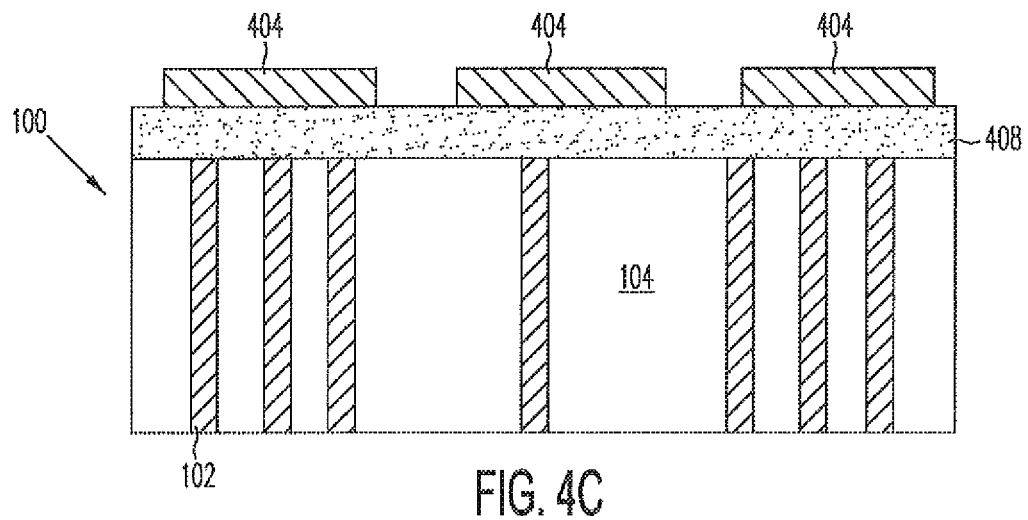

FIGS. 4A through 4H illustrate various configurations using an interposer or substrate 100 according to some embodiments of the present invention. FIG. 4A illustrates a configuration with devices 404 attached to a top side of interposer 100 and devices 406 attached to a bottom side of interposer 100. FIG. 4B illustrates a configuration with a layer 408 deposited on a top side of interposer 100. Layer 408 can be a redistribution layer (RDL) or a back end-of-line layer (BEOL) and can also be formed using polyimide aerogel or a low K material as the dielectric in the RDL or BEOL structure. FIG. 4C illustrates a configuration with layer 408 and devices 404 attached on layer 408. The advantages of these configurations result from the electrical insulation in interposer 100 formed from low k material (k<1), the thermal barrier provided by interposer 100, and flexible and conformal electronics.

Additionally, the porous polyimide or mesoporous material 408 provides high mechanical strength and also blunts stress fields and blunts propagating cracks that may originate from the presence of devices 404. In some embodiments, the layer 408 may deform microscopically locally to cushion the large stresses generated by the presence of various devices 404 and electrical elements 102. The suppression of stress fields and crack propagation protects the devices 404 from cracking and experiencing stress fields from neighboring devices in microelectronic packages.

In some embodiments, there are no conducting thru-electrodes in the polyimide aerogel or mesoporous layer 104. Conductive features can be formed in the patterned mesoporous layer 104 by damascene or non-damascene method or by combination of both methods. A suitable dielectric layer or the polyimide aerogel or polyimide layer can be used to fabricated multilevel metallization feature over the layer 104. Various homogenous and/or heterogeneous devices may be assembled or attached or couple electrically and mechanically to the metallization features or pads disposed over layer 104. The various attached said devices communicate with each other through the interconnect layer disposed over layer 104. In some embodiments, active or passive devices can be embedded in layer 104 and the embedded devices can communicate with other devices via their terminals exposed on the top or bottom surface of layer 104.

Figure 4D:
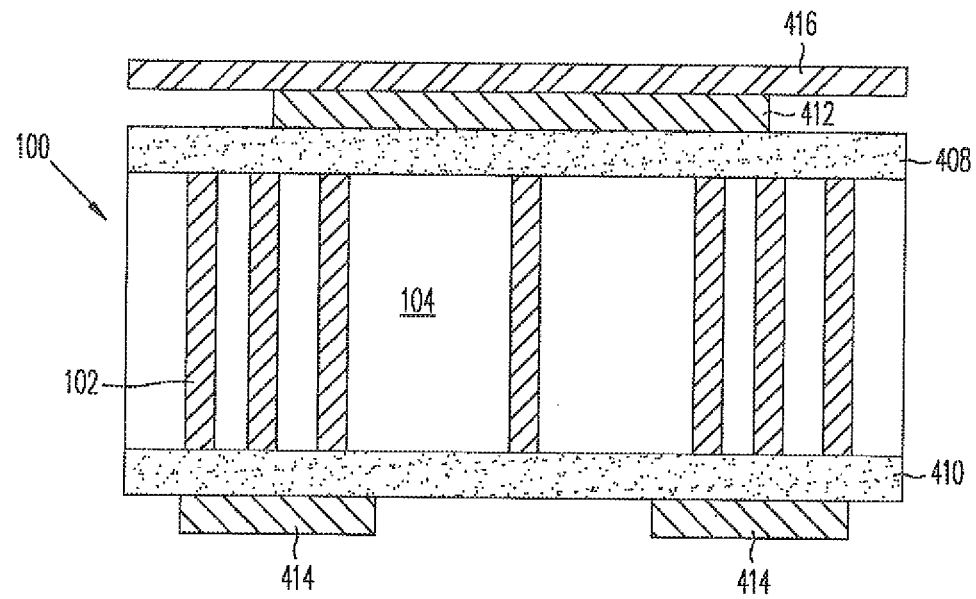
Figure 4E:
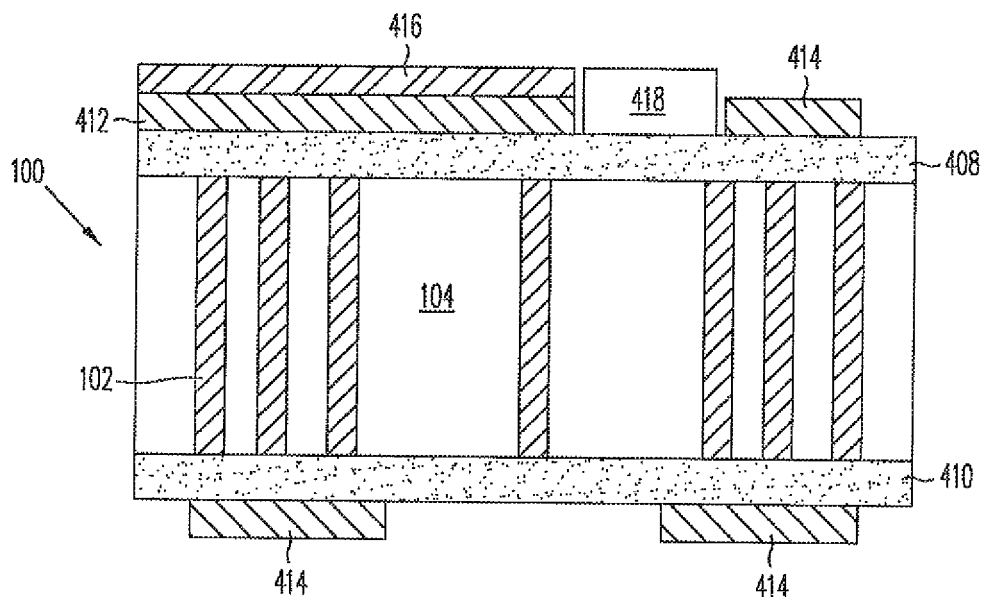

FIGS. 4D and 4E illustrate a configuration that keeps memory cool from the heating of a microprocessor. As shown in FIG. 4D, a top layer 408, which can be an RDL or BEOL, is deposited on top of interposer 100 while a bottom layer 410, which also can be an RDL or BEOL formed with polyimide aerogel, is deposited on the bottom side of interposer 410. A microprocessor or a graphics microprocessor 412 is attached to top layer 408. Memory 414 is attached to bottom layer 410. An optional heat sink 416 can be attached on top of microprocessor 412. In this configuration, memory 414 is well insulated thermally from microprocessor 412 while electrical contact is between microprocessor 412 and memory 414 is made through top layer 408, bottom layer 410, and interposer 100. In some embodiments, the device 414 can be located on the same surface as the heat generating device 412, but further away, for example by more than 100 microns, from device 412 without causing higher warpage in the interposer 100. In some applications, the second device 414 can be located more than 200 microns from the first device and the said device relative disposition not degrading interposer or substrate warpage.

FIG. 4E shows a configuration where a memory 414 is deposited to the top side of layer 408 with microprocessor 412 and is separated from microprocessor 412 by a spacer 418. Spacer 418 can be formed of porous polyimide or a mesoporous layer or their combination on top layer 408 between microprocessor 412 and memory 414. Again, memory 414 placed on top layer 408 is thermally insulated from microprocessor 412 while also making electrical contact through metallization in top layer 408. An optional heat sink 416 can be attached on top of microprocessor 412 to further remove heat.

Figure 4F:
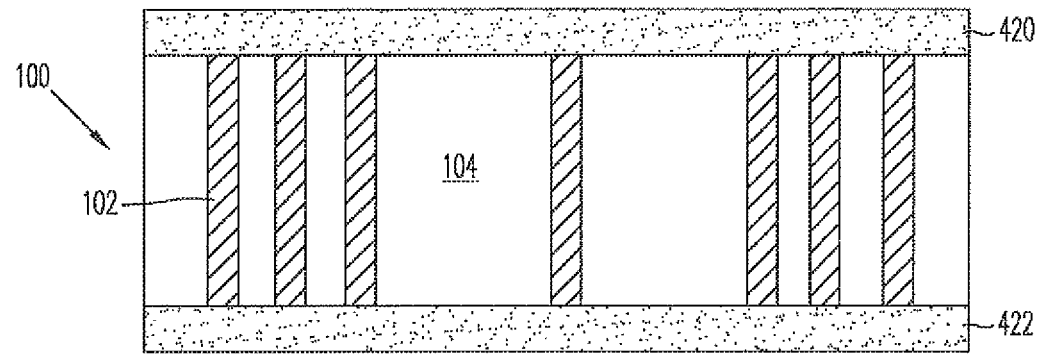
Figure 4G:
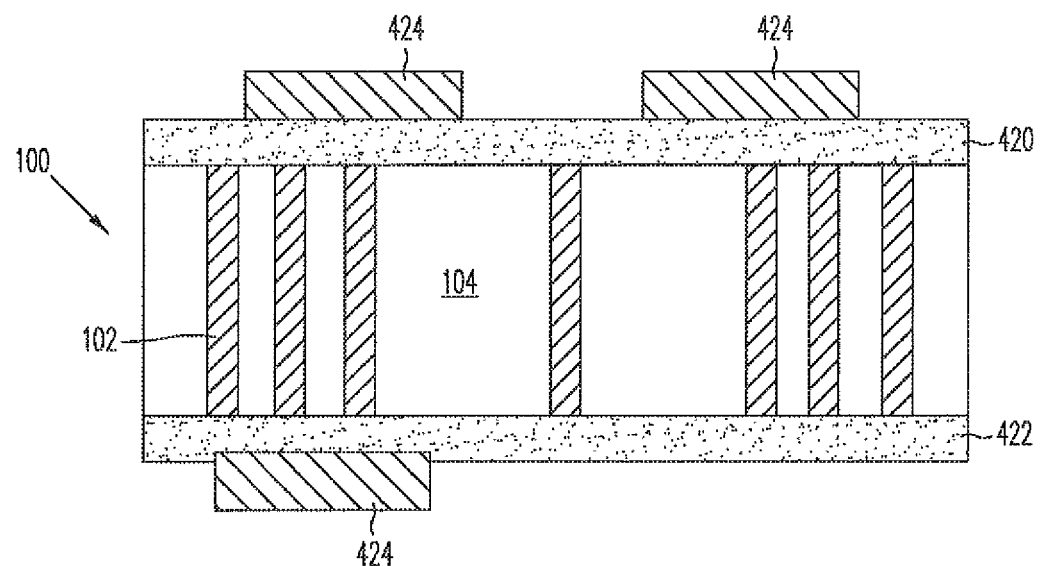

FIGS. 4F and 4G illustrate a configuration where the top layer 420 comprises a layer containing high modulus fiber layer 420 and a bottom layer 422 comprising a layer similar to the top layer 420 on the interposer 100. Top fiber layer 420 and bottom fiber layer 422 can be high-Young's modulus fiber composite layers (for example Kevlar) that provide additional structural stiffness to interposer 100. The layers 420 and 422 may be continuous or discontinuous and the layers 420 and 422 may be thicker in some regions or portions of the surface than in other areas. For example, in some applications, the layer 420 or 422 or both may be selectively disposed around the periphery of the top surface and bottom surface of layer 104. FIG. 4G illustrates devices 424 attached to top fiber layer 420 and bottom fiber layer 422. The fiber layers can help provide for a low warpage interposer. Conductive path ways, not shown, may be formed through layer 420 and contact pads formed over the conductive pathways. Device 424 may be attached on the formed contact pads.

Figure 4H:
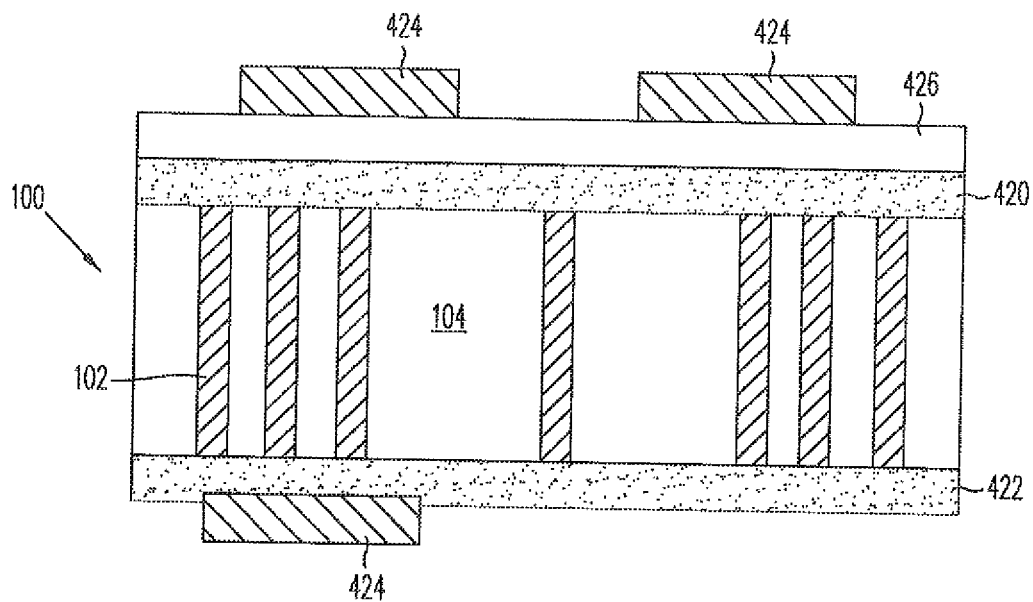

FIG. 4H illustrates addition of a top layer 426 over top fiber layer 420. Top layer 426 can be, for example, an RDL layer, which also may be formed from porous polyimide. Devices 424 can then be attached to top layer 426. In some embodiments, fiber layer 420 is a good thermal conductor. Conductive path ways, not shown, may be formed through layers 420 and 426 with contact pads formed over the conductive pathways. Device(s) 424 may be attached on the formed contact pads.

In other embodiments of this invention layer 104 comprise a mesoporous inorganic material formed by aerogel and thermal methods. In one application, Young's modulus of the inorganic mesoporous layer 104 is higher than the dielectric layer formed on the top or bottom surface of the mesoporous layer 104. While the implementations described above generally indicate that the metal features 102 are formed and patterned before foam layer 104 is formed, this is not a requirement. The foam layer 104 maybe formed first with openings formed therein. The metal features 102 may then be formed within the openings as described above, e.g. with regard to FIG. 3B.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

What is claimed is:

1. A substrate structure, comprising:
   a porous polyimide material;
   a plurality of electrodes extending in the porous polyimide material;
   a barrier layer coating each of the electrodes to isolate each of the plurality of electrodes from the porous polyimide material; and
   a first redistribution layer on a first side of the porous polyimide material, the redistribution layer making electrical contact with the electrodes.

2. The structure of claim 1, further including a second redistribution layer on a second side of the porous polyimide material, the electrodes providing electrical paths from the first redistribution layer to the second redistribution layer.

3. The structure of claim 1, further including a porous spacer formed over the first redistribution layer to thermally separate a first device from a second device.

4. A substrate structure, comprising:
   a porous polyimide material;
   a plurality of electrodes extending in the porous polyimide material;
   a barrier layer coating each of the electrodes to isolate each of the plurality of electrodes from the porous polyimide material; and
   a top fiber based layer on a top side of the porous polyimide material.

5. The structure of claim 4, further including a bottom fiber based layer on a bottom side of the porous polyimide material.

6. The structure of claim 4, further including a top redistribution layer over the top fiber based layer.

* * * * *